United States Patent
Matsumoto

(10) Patent No.: US 8,330,104 B2
(45) Date of Patent: Dec. 11, 2012

(54) PATTERN MEASUREMENT APPARATUS AND PATTERN MEASUREMENT METHOD

(75) Inventor: Jun Matsumoto, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 13/134,290

(22) Filed: Jun. 3, 2011

(65) Prior Publication Data

US 2011/0233400 A1    Sep. 29, 2011

Related U.S. Application Data

(63) Continuation of application No. PCT/JP2008/073708, filed on Dec. 26, 2008.

(51) Int. Cl.
 *H01J 37/28* (2006.01)
 *H01J 37/22* (2006.01)
 *G01B 15/00* (2006.01)

(52) U.S. Cl. ........ 250/310; 250/306; 250/309; 250/311; 250/491.1; 716/20; 716/21; 716/53; 716/54; 430/5; 430/30

(58) Field of Classification Search .......... 250/306, 250/309, 310, 311, 491.1; 716/19, 20, 21, 716/53, 54; 430/5, 30
See application file for complete search history.

(56) References Cited

U.S. PATENT DOCUMENTS

| | | | |
|---|---|---|---|
| 6,509,750 B1* | 1/2003 | Talbot et al. ............. 324/754.22 | |
| 6,835,510 B2* | 12/2004 | Chen et al. ........................ 430/5 | |
| 7,175,940 B2* | 2/2007 | Laidig et al. ...................... 430/5 | |
| 7,391,023 B2* | 6/2008 | Enichen et al. ................ 250/310 | |
| 7,397,252 B2* | 7/2008 | Zhou et al. ..................... 324/600 | |
| 7,420,168 B2* | 9/2008 | Mizuno et al. ................. 250/311 | |
| 7,590,506 B2* | 9/2009 | Matsumoto ..................... 702/167 | |
| 7,908,572 B2* | 3/2011 | Zhang .............................. 716/53 | |
| 2002/0000550 A1* | 1/2002 | Yang et al. ....................... 257/48 | |
| 2002/0116135 A1* | 8/2002 | Pasika et al. ..................... 702/21 | |
| 2005/0207673 A1* | 9/2005 | Takane et al. ................. 382/286 | |
| 2005/0226494 A1* | 10/2005 | Yamamoto et al. ........... 382/149 | |
| 2012/0104254 A1* | 5/2012 | Shishido et al. .............. 250/310 | |

FOREIGN PATENT DOCUMENTS

| | | |
|---|---|---|
| JP | 61-290313 | 12/1986 |
| JP | 62-002116 | 1/1987 |
| JP | 05-296754 | 11/1993 |
| JP | 2003-121132 | 4/2003 |
| JP | 2005-156436 | 6/2005 |
| JP | 2005-228560 | 8/2005 |

\* cited by examiner

*Primary Examiner* — David A Vanore

(74) *Attorney, Agent, or Firm* — Muramatsu & Associates

(57) ABSTRACT

A pattern measurement apparatus includes a beam intensity distribution creation unit to scan a charged particle beam over a reference pattern having edge portions formed at a right angle to create a line profile of the reference pattern and thus create a reference-beam intensity distribution, an edge width detection unit to determine line profiles for pattern models including edges formed at various inclination angles by use of the reference-beam intensity distribution and calculate edge widths reflecting an influence of a width of a reference beam, and a correspondence table creation unit to calculate correction values for edge positions from the calculated edge widths and the pattern models and create a correspondence table in which the edge widths and the correction values are associated with one another.

10 Claims, 13 Drawing Sheets

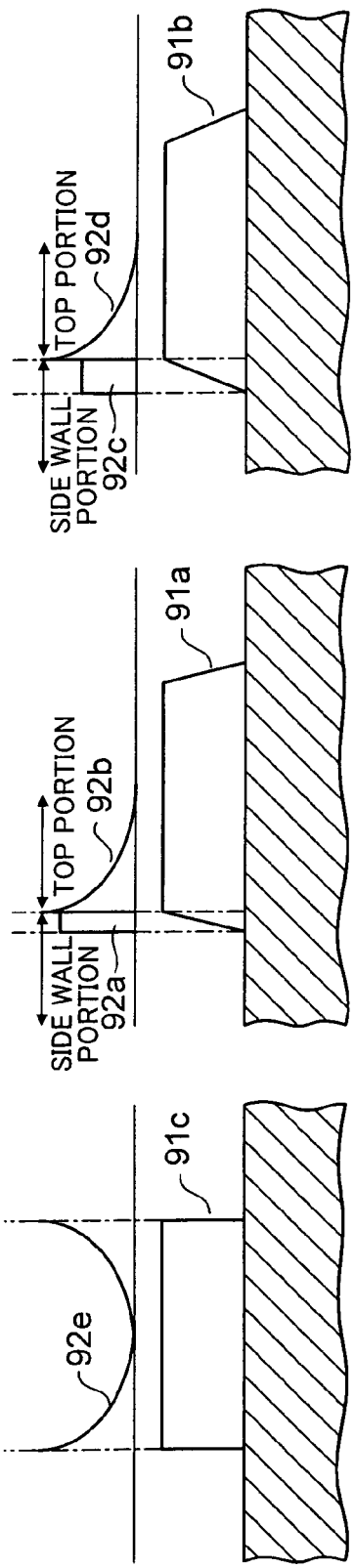

PATTERN MEASUREMENT APPARATUS AND PATTERN MEASUREMENT METHOD

CROSS-REFERENCE TO RELATED APPLICATIONS

This application is a continuation of prior International Patent Application No. PCT/JP2008/073708, filed Dec. 26, 2008, the entire contents of which are incorporated herein by reference.

BACKGROUND OF THE INVENTION

1. Field of the Invention

The present invention relates to a pattern measurement apparatus and a pattern measurement method using a charged particle beam, and in particular to a pattern measurement apparatus and a pattern measurement method capable of accurate length measurement regardless of the edge width of a pattern.

2. Description of the Related Art

As a method of measuring the line widths of patterns, there is a method such as a one performing measurement using a scanning electron microscope (SEM). In the scanning electron microscope, a sample is irradiated with and scanned by incident electrons within an electron beam scanning range, and secondary-electrons emitted from the sample are acquired through a scintillator. Then, the quantity of the acquired electrons is converted into luminance values and displayed on a display.

When such a scanning electron microscope is used to manage the characteristics of a semiconductor device, an operation is conducted in general to inspect whether or not a pattern is formed to have a line width within a design standard. In order to manage the line width of a pattern, the following procedure is carried out. The procedure includes steps of displaying a predetermined region of a pattern formed on a photomask on a display, aiming an electron beam at a measurement point set within the displayed region and applying it onto the measurement point, and then acquiring a luminance distribution waveform on the basis of secondary electrons reflected from the measurement point. Thereafter, high level portions in the luminance distribution waveform are regarded as pattern edges, and a width between two pattern edges is determined as a line width. Then, a further determination is performed about whether or not this line width falls within a tolerance range. As a result, if the line width falls within the tolerance range, the procedure moves to the next step. On the contrary, if the line width is out of the tolerance range, the procedure returns to the pattern-formation processing step.

As described above, the measurement of line widths of patterns is important in the manufacturing process of semiconductor devices. Thus, various techniques have been proposed to accurately measure the line widths.

In general, a largest position for the gradient of luminance corresponding to the quantity of secondary electrons is defined as an edge position of a pattern. Meanwhile, Japanese Laid-open Patent Publication No. 05-296754 discloses an edge detection method in which a local minimum value position for a secondary electron signal is considered as an edge position.

As described above, in a case where the scanning electron microscope is used to measure the line width of a pattern, there is employed the method in which the largest position for the gradient of luminance is defined as the edge position or the method in which the local minimum value position for the secondary electron signal is defined as the edge position.

However, it has been found that detection of such edge position may result in an inconvenience as follows.

Specifically, as the inclination angles of edge portions of a pattern become steeper and thus a width of each of such edge portions becomes smaller, an accurate length measurement of the pattern becomes impossible. In the pattern length measurement, as described above, the pattern is irradiated with and scanned by an electron beam to create a line profile, and then the line profile is differentiated to calculate the line width. Accordingly, depending on a diameter of the electron beam, it is likely to detect secondary electrons reflecting information including not only the intensity corresponding to the pattern but also the intensity of the beam itself. This results in a situation where the line width cannot be measured accurately.

There has been so far no report regarding a technique to accurately measure a line width from a length measurement value of the pattern with a small edge width.

SUMMARY OF THE INVENTION

The present invention has been made in view of the above problem of the conventional techniques, and an object thereof is to provide a pattern measurement apparatus and a pattern measurement method capable of accurate pattern length measurement even in the case where the width of each edge portion of a pattern is smaller than a beam diameter.

The above problem is solved by a pattern measurement apparatus including a beam intensity distribution creation unit configured to scan a charged particle beam over a reference pattern formed on a sample to create a line profile of the reference pattern, and create a reference-beam intensity distribution in which the charged particle beam is regarded as a reference beam, where the reference pattern has edge portions formed at a right angle to a horizontal plane, an edge width detection unit configured to determine line profiles for pattern models by use of the reference-beam intensity distribution, and calculate edge widths reflecting an influence of a width of the reference beam, where the pattern models include edges formed at various inclination angles, and a correspondence table creation unit configured to calculate correction values for edge positions based on the calculated edge widths and the pattern models, and create a correspondence table in which the edge widths and the correction values are associated with one another.

In the pattern measurement apparatus according to this aspect, the reference-beam intensity distribution may include a first distribution on a first side of an intensity distribution at a rising point of the reference pattern and a second distribution on a second side of the intensity distribution at a falling point of the reference pattern, the first and second sides being where the reference pattern is not formed. The line profiles for the pattern models including the edges formed at the various inclination angles may be created by combining the line profile of the reference pattern and corresponding line profiles of edge portions, the line profiles of corresponding edge portions being created by calculating amounts corresponding to overlaps between the reference beam and the edge portions under the assumption that an electron beam having the reference-beam intensity distribution is applied to the pattern models in a scanning manner.

Moreover, in the pattern measurement apparatus according to this aspect, the pattern measurement apparatus may further include a line width measurement unit configured to measure a line width of a pattern, and the line width measurement unit may measure an edge width and edge positions of a pattern formed on a sample, set the edge width and the edge positions as a temporary edge width and temporary edge positions, detect a correction value for each of the temporary edge positions by referring to the correspondence table, and correct each of the temporary edge positions by using the correction value to thereby calculate the line width of the pattern. The correspondence table creation unit may further create an edge width correspondence table in which edge widths of the pattern models and the edge widths calculated by the edge width detection unit are associated with one another, and the line width measurement unit may calculate an inclination angle of each edge of the pattern based on a height of the pattern and a real edge width which is obtained by referring to the edge width correspondence table for the temporary edge width.

In the present invention, the line profile of the reference pattern is created by scanning a charged particle beam over the pattern having edge portions formed on a sample at a right angle. Then, the reference-beam intensity distribution is created on the basis of the line profile. The line profiles are created for the pattern models including edges formed at various inclination angles through simulations using the reference-beam intensity distribution. Edge widths are calculated from the created line profiles to thereby calculate the edge widths reflecting an influence of a width or diameter of the reference beam.

Based on the edge widths obtained through simulations and the pattern models, the correction values for the edge positions are calculated to create the correspondence table in which the edge widths and the calculated correction values are associated with one another. This correspondence table is utilized to correct the measurement value, and which makes it possible to perform accurate length measurement even when the actually measured line width includes an error due to a small width of each edge portion.

The above problem is solved by a pattern measurement method including the steps of scanning a charged particle beam over a reference pattern to create a line profile of the reference pattern, the reference pattern being formed on a sample and having edge portions formed at a right angle to a horizontal plane, creating a reference-beam intensity distribution in which the charged particle beam is regarded as a reference beam, on the basis of the line profile, creating line profiles for pattern models on the basis of the reference-beam intensity distribution, the pattern models including edges formed at various inclination angles, creating differential profiles by differentiating the line profiles, calculating edge widths reflecting an influence of a width of the reference beam, from the differential profiles, and calculating correction values for edge positions from the calculated edge widths and the pattern models, and creating a correspondence table in which the edge widths and the correction values are associated with one another.

BRIEF DESCRIPTION OF THE DRAWINGS

FIGS. 5A to 5C are views illustrating the intensity distributions of secondary electrons obtained by applying an electron beam onto patterns having various edge angles.

DESCRIPTION OF THE PREFERRED EMBODIMENT

Figure 1:
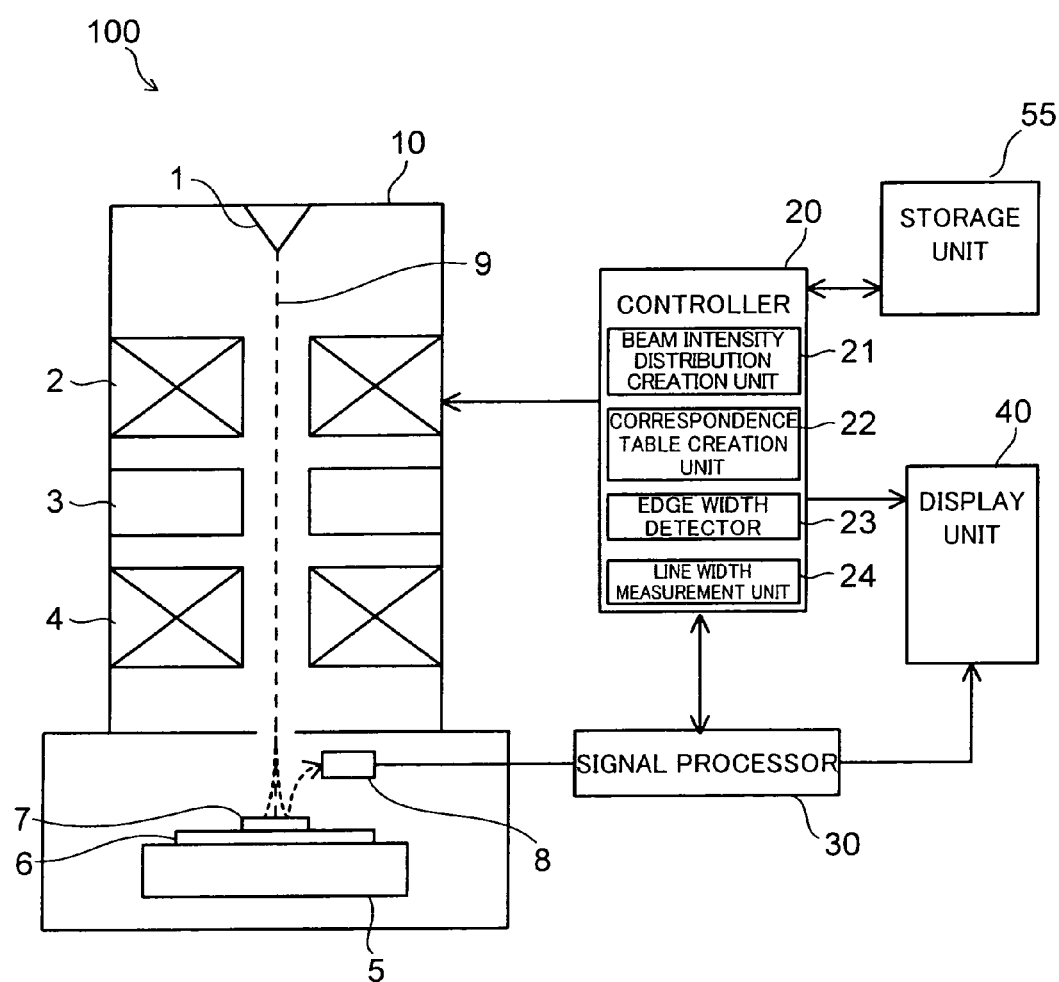
FIG. 1 is a configuration view of a scanning electron microscope used in an embodiment of the present invention.

Hereinbelow, an embodiment of the present invention is described by referring to the drawings.

First, a configuration of a scanning electron microscope (SEM) used as a pattern measurement apparatus is described. Next, a general method of measuring the line width of a pattern is described. Then, the relationship between the width of an edge portion and the beam width (beam diameter) is described, and a technique that allows accurate length measurement of a line width even when an edge width is small is described. Lastly, a pattern measurement method to which the pattern detection method of the present invention is applied is described.

(Configuration of Scanning Electron Microscope)

FIG. 1 is a configuration view of a scanning electron microscope according to this embodiment.

This scanning electron microscope 100 mainly includes an electron scanning unit 10, a signal processor 30, an image display unit 40, a storage unit 55, and a controller 20 controlling each of the electron scanning unit 10, the signal processor 30, the image display unit 40 and the storage unit 55. The controller 20 has a beam intensity distribution creation unit 21, a correspondence table creation unit 22, an edge width detector 23 and a line width measurement unit 24.

The electron scanning unit 10 has an electron gun 1, a condenser lens 2, a deflection coil 3, an objective lens 4, a movable stage 5 and a sample holder 6.

Charged particles (for example, in a form of an electron beam) 9 are applied from the electron gun 1 onto a sample 7 on the movable stage 5 through the condenser lens 2, the deflection coil 3 and the objective lens 4.

Secondary electrons emitted from the sample 7 by the irradiation with the charged particles 9 are detected by an electron detector 8 configured of a scintillator or the like. The quantity of the secondary electrons thus detected is converted into a digital value by an AD converter of the signal processor 30 and then stored in the storage unit 55 as image data. The image data is converted into luminance signals and then displayed on the image display unit 40. Here, the image data includes information indicating the region where the image is acquired, the magnification of the SEM (scanning electron microscope), and the like. The controller 20 controls the electron-deflection amount of the deflection coil 3 and the image-scanning amount of the image display unit 40. In addition, the controller 20 stores therein a program for executing line width measurement.

The beam intensity distribution creation unit 21 creates the intensity distribution of the charged particle beam itself used in the apparatus. The beam intensity distribution of the charged particle beam denotes the distribution of the amount of beam at the time of applying the beam onto the sample.

The correspondence table creation unit 22 creates a correspondence table. The correspondence table denotes a relationship between edge widths obtained through simulations and correction values for correcting an influence of a width of the charged particle beam over an edge position with respect to a real edge width.

The edge width detector 23 detects edge widths by using the intensity distribution of the charged particle beam on pattern models including edges formed at various inclination angles.

The line width measurement unit 24 measures a line width by creating the line profile of a specified area and applying differentiation processing thereto.

(General Method of Measuring Line Width of Pattern)

Figure 2A:
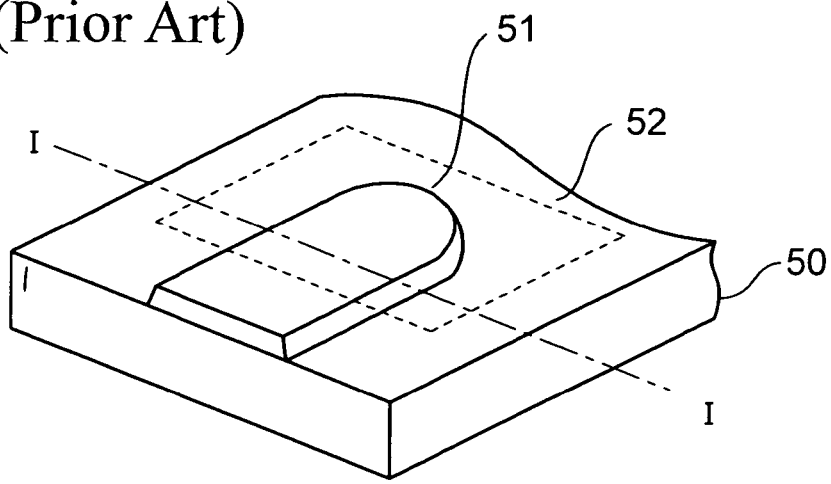
FIGS. 2A to 2C are views for describing an electron image and a profile acquired by a signal processor.

Next, a description is given of a general method of measuring the line width of a pattern of a sample illustrated in FIG. 2A by using the scanning electron microscope 100 illustrated in FIG. 1.

As an example, the sample 7 has a wiring pattern 51 formed on an underlayer 50 of a semiconductor wafer or photomask substrate as illustrated in FIG. 2A. A part of the sample 7 is a planer shape as illustrated in FIG. 2A. Here, the portion surrounded by a broken line 52 denotes an observed area of the scanning electron microscope 100.

Figure 2B:
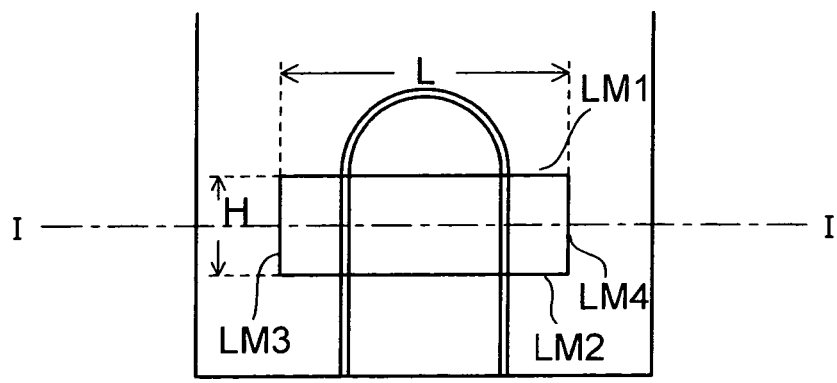

FIG. 2B illustrates an example of an SEM image obtained by causing the electron detector 8 to detect the quantity of secondary electrons or the like obtained by scanning the sample illustrated in FIG. 2A with an electron beam, converting the detected quantity of the electrons into luminance signals, and displaying it in a two-dimensional fashion in accordance with scanning position of the electron beam.

A length measurement area is specified on the SEM image illustrated in FIG. 2B, and a corresponding SEM image is extracted therefrom. The length measurement area is set to be an area whose L×H is equal to 400 pixels. The operator selects this area by use of an upper line marker LM1, a lower line marker LM2, a left line marker LM3 and a right line marker LM4.

The extracted SEM image pixel data is divided into areas with respect to the direction H of the length measurement area, and a line profile corresponding to luminance distribution is obtained for each of the divided areas. Note that, when the line profile is to be obtained, it is possible to reduce noise components by performing smoothing processing in the length L direction with a three-pixel width, for example.

Figure 2C:
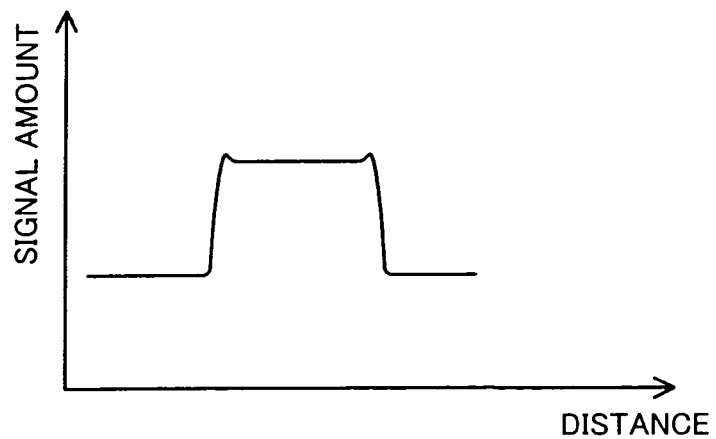

FIG. 2C is a view illustrating a line profile corresponding to the quantity of the secondary electrons emitted from the sample, which can be acquired upon irradiation with an electron beam along the I-I line of FIG. 2A. As illustrated in FIG. 2C, the line profile drastically changes at the edge portions of the pattern. In order to determine the positions where the line profile drastically changes, the line profile is differentiated and the maximum peak and the minimum peak in the amount of the differential signal are detected. The width of the line pattern is determined as the distance between the position of the maximum peak and the position of the minimum peak.

The aforementioned processing is performed for each of the divided areas. Then, the average value of the widths of the pattern calculated for the respective areas is defined as a length measurement value.

(Relationship Between Edge Width and Beam Width)

Figures 3A, 3B, 3C:
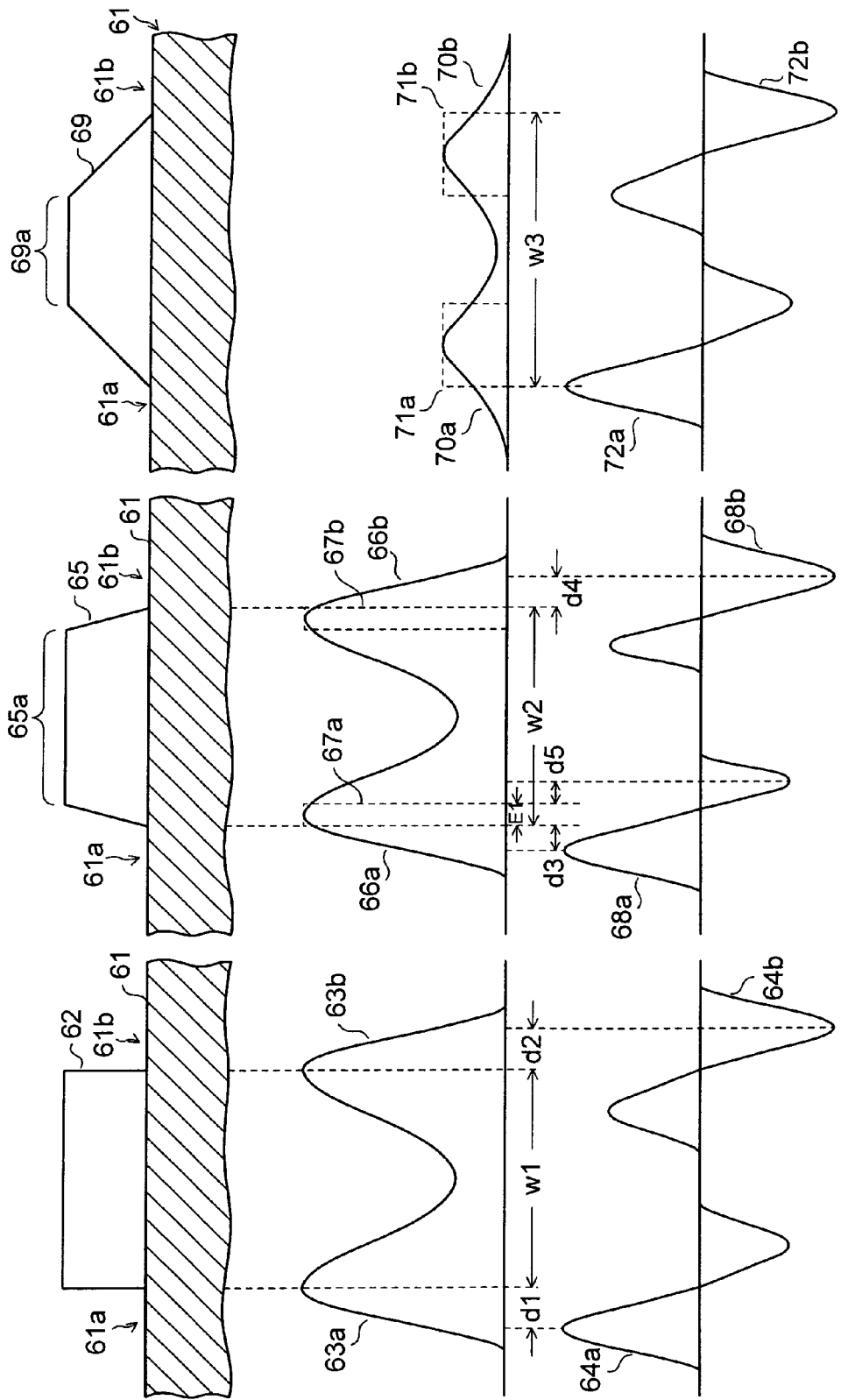
FIGS. 3A to 3C are views for describing profiles corresponding to various edge angles.

FIGS. 3A-3C illustrate patterns formed on a sample 61, line profiles respectively representing luminance signals obtained from SEM images of the patterns, and differential profiles respectively obtained by subjecting the line profiles to primary differentiation. FIGS. 3A-3C illustrate three cases differing from each other in the inclination angle of each edge portion (the width of each edge portion) of the line pattern.

FIG. 3A illustrates a case where each edge portion of a pattern 62 on the sample 61 is formed at a right angle to the surface of the sample 61. FIGS. 3B and 3C illustrate cases where the edge portions are inclined. Moreover, FIG. 3B illustrates a case where the inclination of each edge portion is steeper than that of FIG. 3C.

In the case as illustrated in FIG. 3A where each edge portion is at a right angle to a surface of the sample 61, line profiles 63a and 63b in FIG. 3A are obtained. The line profiles 63a and 63b are differentiated to obtain differential profiles 64a and 64b.

As illustrated by the line profiles 63a and 63b in FIG. 3A, the amount of signal of each line profile becomes large at the corresponding boundary of an area where the pattern 62 is not formed (hereinafter, referred to as space) and the pattern 62.

The intensity distribution of the secondary electrons is said to be proportional to $1/\cos\theta$, where $\theta$ represents a sample surface angle formed between a surface of the sample 61 and an edge portion of the pattern thereon. However, since recent CD-SEMs employ a technique that suppresses charge-up of the sample, this embodiment assumes that the apparatus normally observes the constant intensity distribution, regardless of the inclination angle of the edge portion. In the case of FIG. 3A, there is no inclined portion in the pattern 61, and therefore the intensities of the secondary electrons from inclined portions are not contained in the line profiles 63a and 63b. In other words, the line profiles 63a and 63b are capturing only the characteristics of diffusion contrasts that are the diffusion of secondary electrons from the side wall portions.

In general, in a line profile, a sharpest position of a gradient is employed as the edge position of the pattern. In order to calculate this sharpest position, the line profile is subjected to primary differentiation, and then, the maximum value and the minimum value of the primary differential profile are found.

The primary differential profiles 64a and 64b in FIG. 3A take the maximum value at a position corresponding to a space 61a and the minimum value at a position corresponding to a space 61b. In this way, the positions of the maximum and minimum values are calculated as positions representing the respective boundaries of the space 61a and the pattern 62, and the space 61b and the pattern 62, i.e., edge positions.

Note, however, that FIG. 3A shows a case of a pattern with right-angled edge portions, and the actual line width of the pattern is W1. In other words, if the line width of the pattern is calculated from the above profiles, the result is W1+d1+d2, calculating the line width longer than the actual line width W1 by d1+d2.

FIG. 3B illustrates an example where the inclination angle of each edge of a pattern 65 formed on the sample 61 is steep, and the width of each edge portion is smaller than the width of the beam. As illustrated by line profiles 66a and 66b in FIG. 3B, the amounts of signals of the line profiles 66a and 66b become large at the boundaries of the space 61a and the pattern 65, and the space 61b and the pattern 65, respectively. The line profiles 66a and 66b in this case are dependent on secondary electrons 67a and 67b generated from the inclined portions of the edges, the diffusion contrast of the top portion 65a, and the intensity distribution of the beam.

The primary differential profiles 68a and 68b in FIG. 3B take the maximum value at a position corresponding to a space 61a and the minimum value at a position corresponding to a space 61b. In this way, the positions of the maximum and minimum values are calculated as positions representing the respective boundaries of the space 61a and the pattern 65, and the space 61b and the pattern 65, i.e., edge positions.

However, as illustrated in FIG. 3B, while the actual line width of the pattern is W2, there is an error equal to d3+d4.

FIG. 3C is an example where the inclination angles of edges of a pattern 69 formed on the sample 61 are gentle, and the width of each edge portion is larger than the width of the beam.

As illustrated by line profiles 70a and 70b in FIG. 3C, the amounts of signals of the line profiles 70a and 70b become large at the respective boundaries of the space 61a and the pattern 69, and the space 61b and the pattern 69. The line profiles 70a and 70b in this case are dependent on secondary electrons 71a and 71b generated from the inclined portions of the edges, the diffusion contrast of the top portion 69a, and the intensity distribution of the beam.

Primary differential profiles 72a and 72b in FIG. 3C take the maximum value at a position corresponding to the boundary of the space 61a and the pattern 69 and the minimum value at a position corresponding to the boundary of the pattern 69 and the space 61b. The positions of the maximum and minimum values represent the respective boundaries of the space 61a and the pattern 69, and the space 61b and the pattern 69, i.e., edge positions. As described above, the positions of the maximum and minimum values in the primary differential profiles 72a and 72b are calculated to find the edge positions, based on which a line width W3 of the pattern can be accurately calculated.

As described above, each edge width can be accurately measured when the edge width is larger than the width or diameter of the charged particle beam such as an electron beam. When the edge width is smaller than the width of the charged particle beam, however, the edge width cannot be measured accurately by the usual method of detecting the edge positions through the differentiation of the line profiles, and therefore the line width of the pattern cannot be measured accurately either.

Now, focus is aimed at the edge widths of the pattern. In FIG. 3B, it is possible to find the width of edge portion of the pattern 65 by the differential profiles obtained upon subjecting the line profiles to primary differentiation.

The primary differential profile 68a takes the local maximum and minimum values around the boundary of the space 61a and the pattern 65. The position of the local maximum value is calculated as a position between the space 61a and a lower portion of the edge of the pattern 65. The position of the local minimum value is calculated as the position of an upper portion of the edge of the pattern 65.

However, as shown in FIG. 3B, while the actual edge width of the pattern 65 is E1, there is an error equal to d3+d5. The occurrence of such an error is possibly caused by the fact that the line profile 66a includes not only the intensity of the secondary electrons from the inclined portion of the edge but also the intensity related to the size (width) of the charged particle beam itself, and that the ratio of the intensity of the charged particle beam to the entire intensity is high.

Meanwhile, in the case of the pattern 69 in FIG. 3C, the primary differential profile 72a takes the local maximum and minimum values around the boundary of the space 61a and the pattern 69. The position of the local maximum value corresponds to a position between the space 61a and a lower portion of the edge of the pattern 69.

In the following, a description is given of a method of accurately measuring the line width even when the edge width is smaller than the width of the beam.

As described above, in the case where the inclination angle of an edge is a right angle, the space-side portion of the diffusion contrast distribution can be considered as approximating the intensity distribution of the charged particle beam. Accordingly, space-side portions of the intensity distributions 63a and 63b in FIG. 3A are combined with an intensity distribution respectively to be set as the intensity distribution of the beam. Specifically, in FIG. 3A, a distribution on the space 61a of the intensity distribution 63a at the rising point of the pattern 62 is combined with the intensity distribution, and a distribution on the space 61b of the intensity distribution 63b at the falling point is combined with the intensity distribution. The combined intensity distribution is set as the intensity distribution of a reference beam.

Using this intensity distribution of the reference beam, line profiles (contrast profiles), which would be obtained upon irradiating patterns having edges of various inclination angles, are calculated through simulations.

Figure 4A:
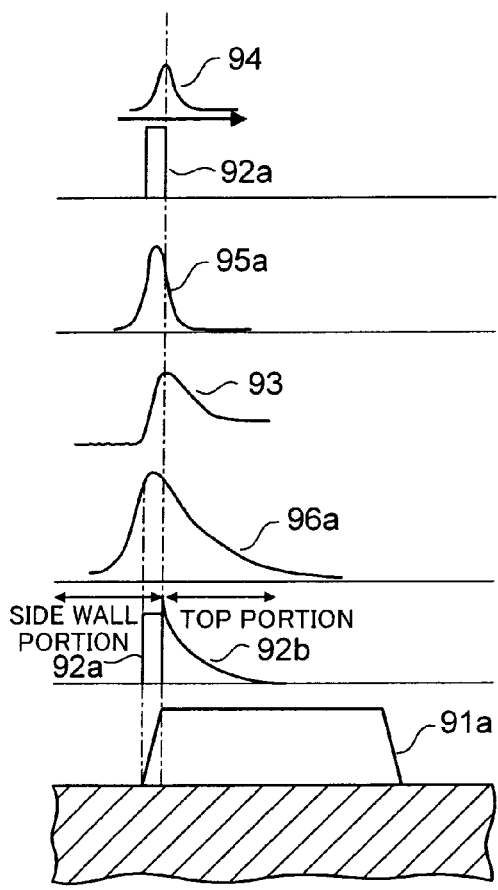
FIGS. 4A and 4B are views for describing an overview of a method of finding the contrast profile of a pattern corresponding to the inclination angle of its edge portion through a simulation.
Figure 4B:
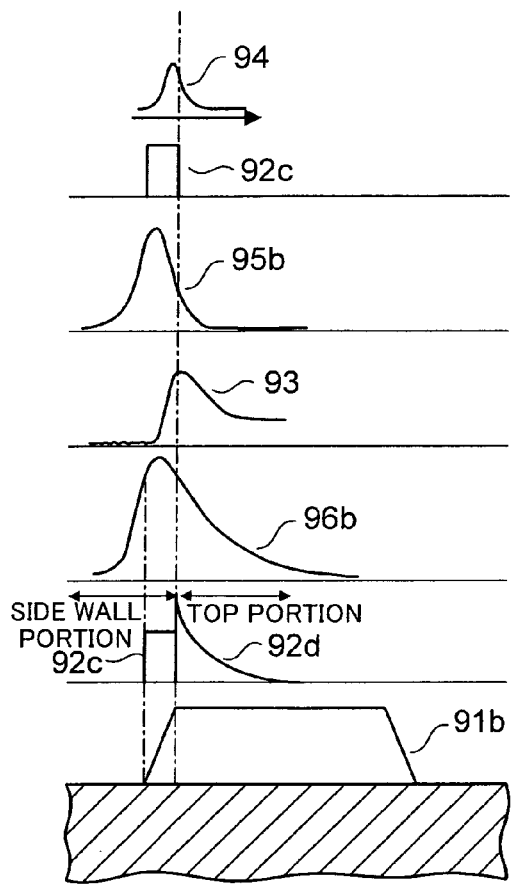

FIGS. 4A and 4B are views for describing an overview of a method of obtaining the contrast profile of a pattern corresponding to the inclination angle of its edge portion through a simulation. FIGS. 4A and 4B illustrate patterns that differ from each other in the inclination angle of the edge portion, but the method of calculating the contrast profile through a simulation is the same.

In FIG. 4A, a contrast profile 96a for a pattern 91a is generated by adding the profile of a side wall portion (edge portion) of the pattern to the profile of a top portion thereof.

FIGS. 5A-5C are views illustrating the intensity distributions of secondary electrons obtained by applying an electron beam onto patterns having various edge angles. As illustrated in FIGS. 5A-5C, in the secondary-electron intensity distribution, the intensity values of the side wall portions 92a, 92c vary in accordance with the width of the edge, and these intensity values become higher as the angles of the edges become steeper. On the other hand, the intensity values of top portions are not dependent on these edge portions and all denote the same secondary-electron intensity distributions 92b, 92d.

Thus, in generating the contrast profile through the simulation, the side wall portion and the top portion are considered separately.

The secondary-electron intensity distribution 92b of the top portion of the pattern 91a in FIG. 4A is considered the same as a distribution in the case where the edge angle is 90 degrees (a secondary-electron intensity distribution 92e in FIG. 5A). Thus, for a contrast profile 93 of the top portion, a contrast profile in the case where the edge angle is 90 degrees (see FIG. 3A) is used.

As for the side wall portion, a contrast profile 95a is generated by performing a simulation using the secondary-electron intensity distribution 92a that corresponds to the angle of the side wall portion and the height of the edge, as well as a reference-beam intensity distribution 94. The generated contrast profile 95a of the side wall portion is added to the profile 93 of the top portion to generate a contrast profile 96a corresponding to the angle of the edge.

Figure 6:
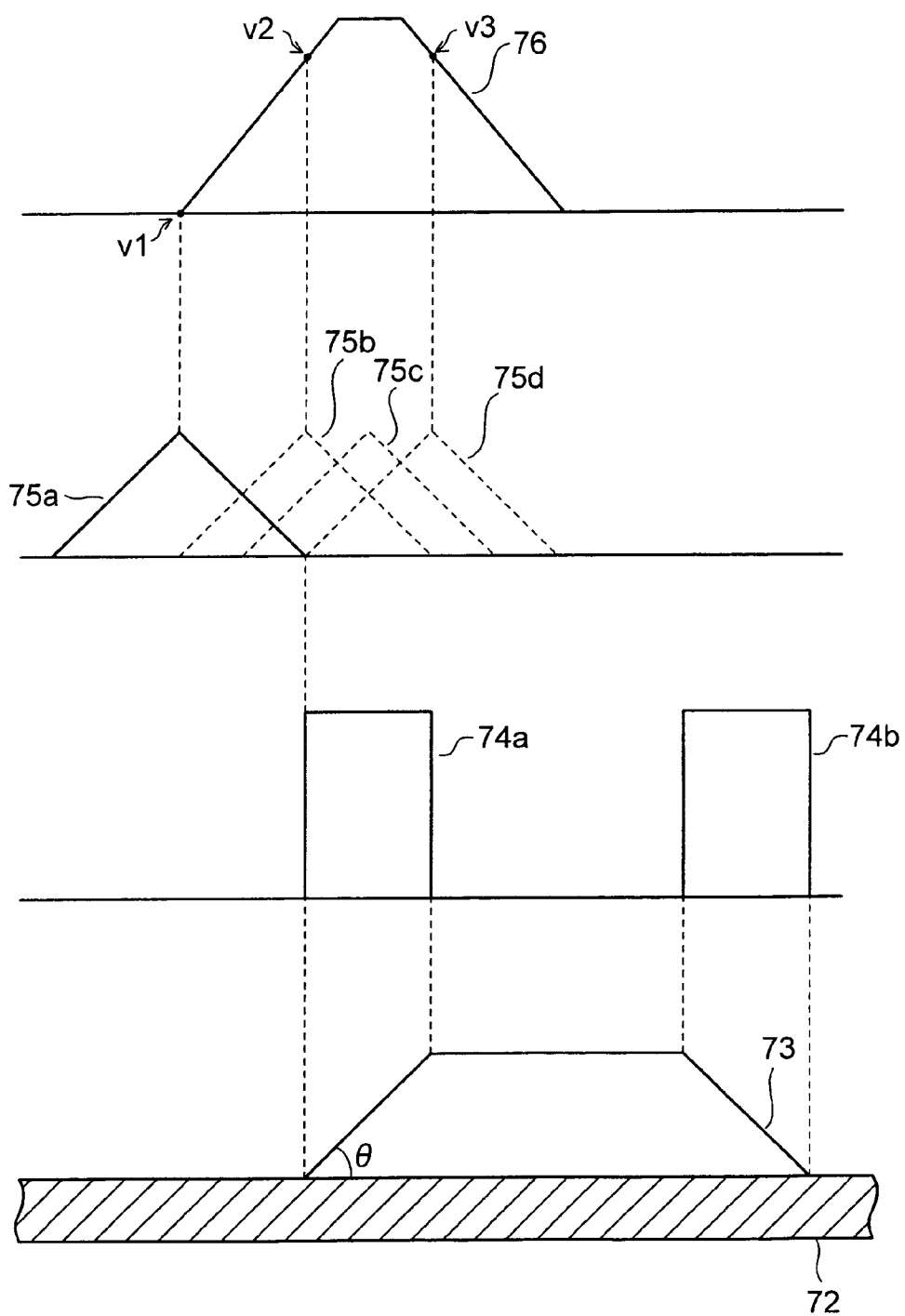
FIG. 6 is a view for describing calculation of a line profile corresponding to the edge inclination angle by use of a reference beam.

FIG. 6 is a view for conceptually describing the simulation method of calculating the contrast profile of the side wall portion that corresponds to the inclination angle of the edge by using the reference-beam intensity distribution.

A pattern 73 with θ as the inclination angle of edge is assumed to be formed on a substrate 72, as illustrated in FIG. 6. Moreover, for the sake of a simple description, the reference beam is assumed to have a triangle intensity distribution like a reference-beam intensity distribution 75a in FIG. 6.

For the edge portions of the pattern 73 in FIG. 6, widths 74a and 74b of the inclined portions are found in accordance with the amounts of secondary electrons generated, respectively. A contrast profile 76 is formed in accordance with an overlap of the inclination width with the reference beam being scanned over it.

When the reference beam is not yet on the edge portion as illustrated by a reference numeral 75a in FIG. 6, the value of the contrast profile is 0 as illustrated by v1. When the reference beam is scanned in the X direction (toward the right in FIG. 6) and applied onto the pattern and the half of the reference beam comes to overlap the edge portion as illustrated by 75b, the value will be as illustrated by v2. Meanwhile, along with the moving of the reference beam from 75a to 75b, the value of the contrast profile increases linearly from v1 to v2.

When the reference beam is scanned further in the X direction and the reference beam becomes symmetrical to 75b as illustrated by 75d, the value will appear as illustrated by v3.

As described above, the contrast profile is created by finding secondary-electron intensities corresponding to the levels of the overlap between the reference beam and the secondary electron intensities of the edge portion.

Figure 7:
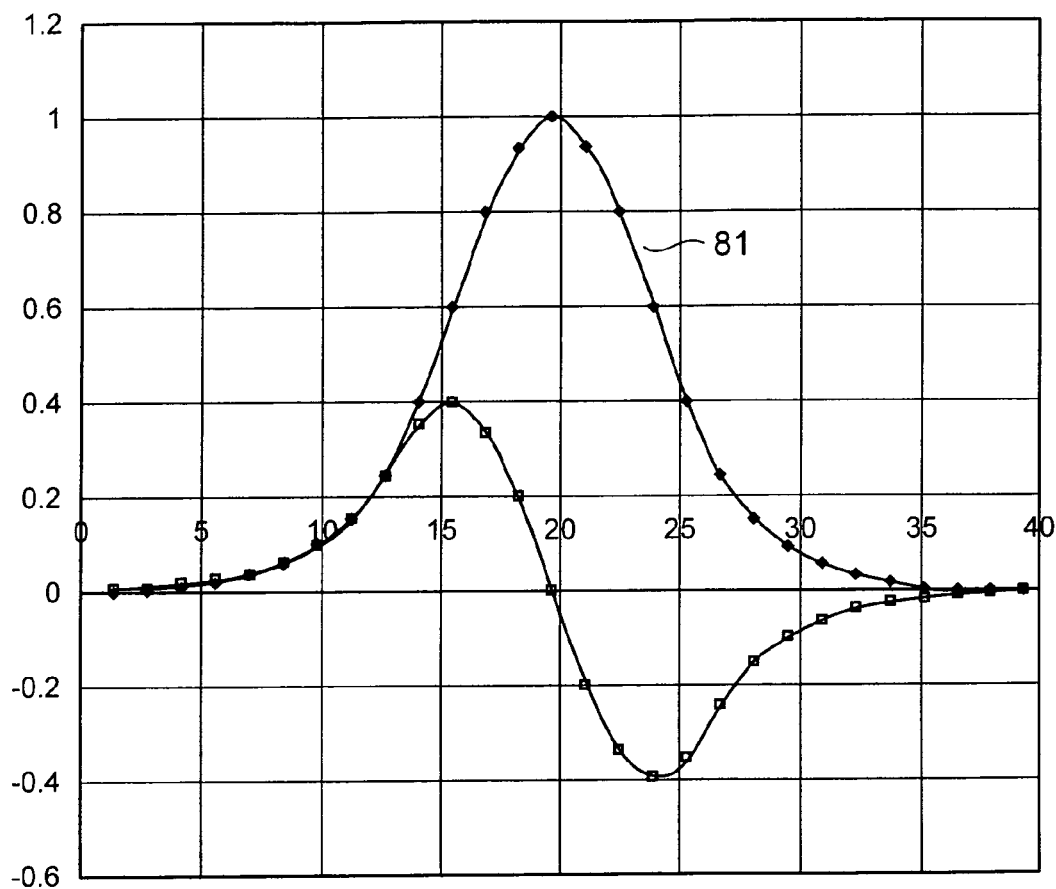
FIG. 7 is a view illustrating an example of the intensity distribution of the reference beam.
Figure 8:
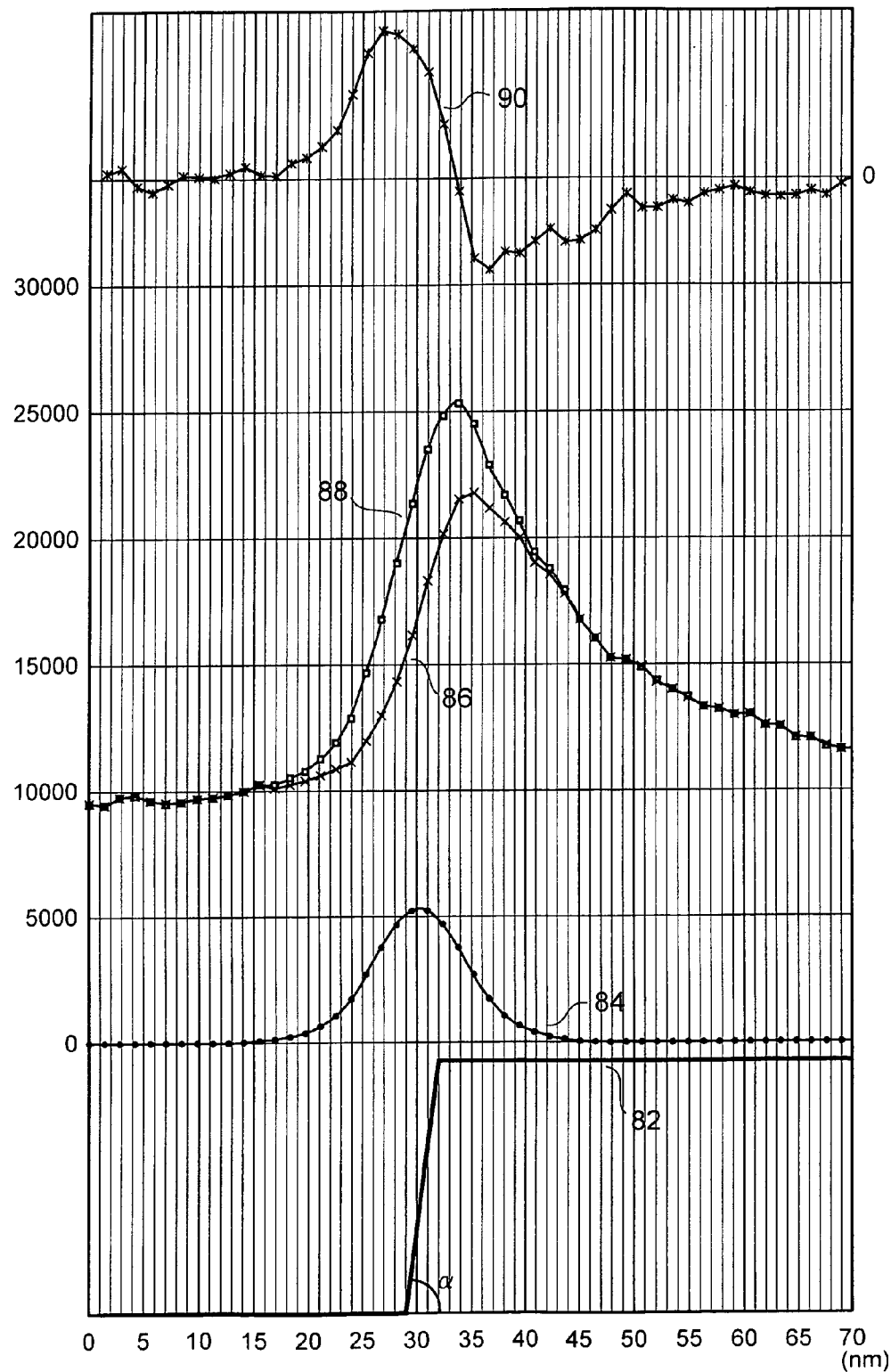
FIG. 8 is a view (part 1) illustrating an example of calculating a line profile for a pattern including edges having a given inclination angle through a simulation.
Figure 9:
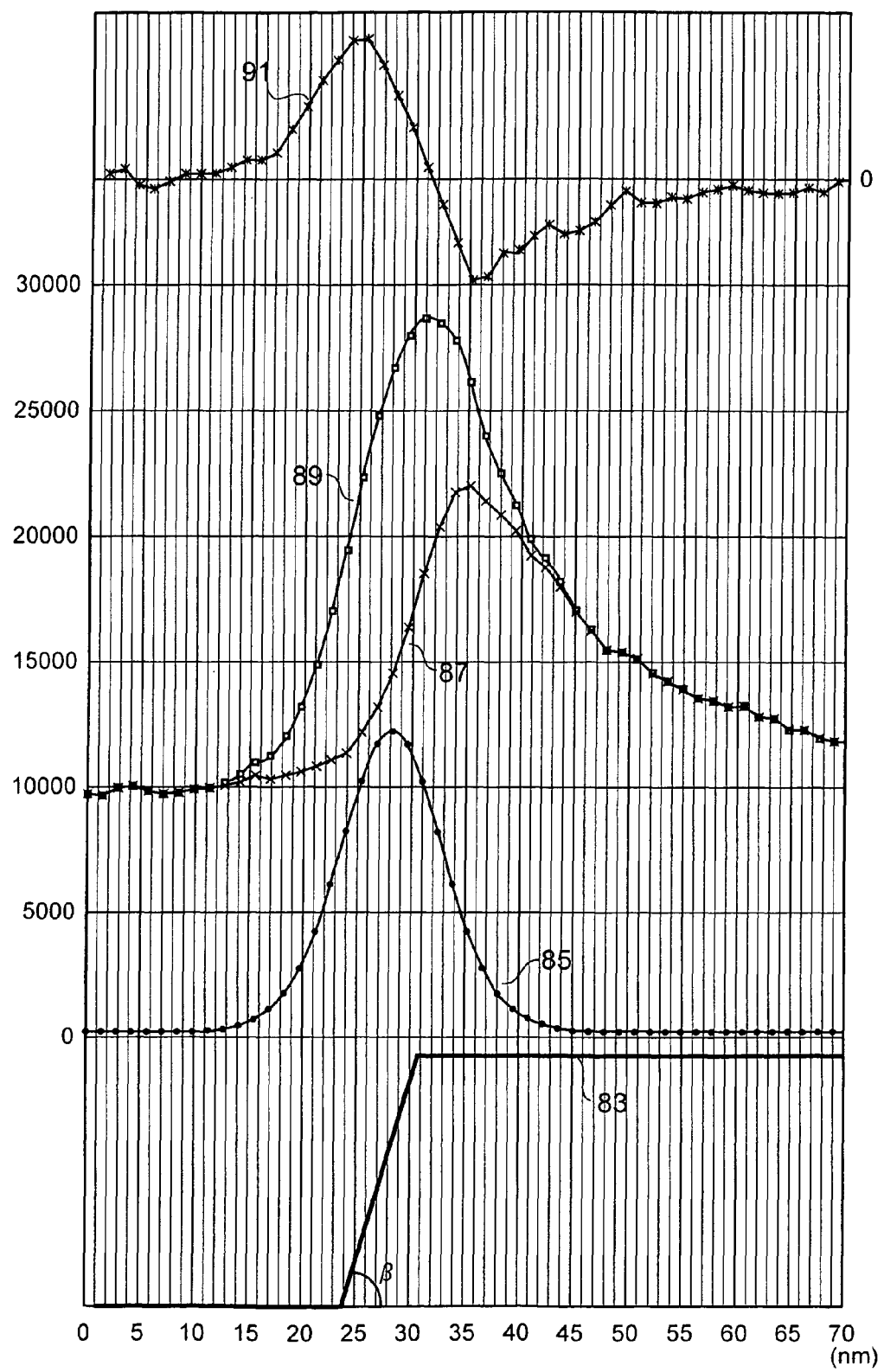
FIG. 9 is a view (part 2) illustrating an example of calculating a line profile for a pattern including edges having a given inclination angle through a simulation.

FIGS. 7 to 9 are views for describing the creation of contrast profiles through simulations. Contrast profiles are calculated through simulations for a pattern model 82 in FIG. 8 and a pattern model in FIG. 9 when the reference-beam intensity distribution is set to have a shape 81 illustrated in FIG. 7. In the pattern model 82, the edge has an inclination angle of α as illustrated in FIG. 8. In the pattern model 83, the edge has an inclination angle of β (<α) as illustrated in FIG. 9.

FIG. 7 illustrates the reference-beam intensity distribution 81 acquired by scanning a charged particle beam over a pattern in which edge portion is formed at a right angle on a sample. The horizontal axis represents the distance while the vertical axis represents the beam intensity.

FIG. 8 is an example where a contrast profile is created for the pattern whose edge has an inclination angle of α. A line denoted by reference numeral 82 in FIG. 8 represents a pattern model whose edge has an inclination angle of α. A line denoted by reference numeral 84 in FIG. 8 represents the contrast profile of an edge portion created through a simulation performed on the pattern model 82 by using the reference beam having the intensity distribution in FIG. 7. Moreover, a line denoted by reference numeral 86 in FIG. 8 represents the contrast profile of a top portion in a case where the inclination angle of the edge is 90 degrees. A line denoted by reference numeral 88 in FIG. 8 represents a profile obtained by adding the contrast profile 86 of the top portion to the simulated profile 84 of the edge portion.

A line denoted by reference numeral 90 in FIG. 8 is a differential profile obtained by differentiating the contrast profile 88. This differential profile 90 is used to simulate a measurement result and find an edge position and an edge width. Then, a correction value for the actual edge position is calculated therefrom, and the relationship between the simulated and the actual edge widths is calculated.

For example, in FIG. 8, a value 3.0 of the actual edge width corresponds to a value 9.0 of the edge width calculated on the basis of the contrast profile 88 obtained by using the reference beam. Then, the value 9.0 of the measurement edge width can be converted to the value 3.0 of the actual edge width, and the correction value for the edge position (the rising position of the pattern model 82) is 2.0.

FIG. 9 is an example where a contrast profile is created for the pattern whose edge has an inclination angle of β. A line denoted by reference numeral 83 in FIG. 9 represents a pattern model whose edge has an inclination angle of β. A line denoted by reference numeral 85 in FIG. 9 represents the contrast profile of an edge portion created through a simulation performed on the pattern model 83 by using the reference beam having the intensity distribution in FIG. 7. Moreover, a line denoted by reference numeral 87 in FIG. 9 represents the contrast profile of a top portion in a case where the inclination angle of the edge is 90 degrees. A line denoted by reference numeral 89 in FIG. 9 represents a profile obtained by adding the contrast profile 87 of the top portion to the simulated profile 85 of the edge portion.

A line denoted by reference numeral 91 in FIG. 9 is a differential profile obtained by differentiating the contrast profile 89. This differential profile 91 is used to simulate a measurement result and find an edge position and an edge width. Then, a correction value for the actual edge position is calculated therefrom, and the relationship between the simulated and the actual edge widths is calculated.

For example, in FIG. 9, a value 7.0 of the actual edge width corresponds to a value 11.4 of the calculated edge width on the basis of the contrast profile 85 obtained by using the reference beam. Then, the value 11.4 of the measurement edge width can be converted to the value 7.0 of the edge width, and a correction value for the edge position (the rising position of the pattern model 83) is 0.2.

Figure 10:
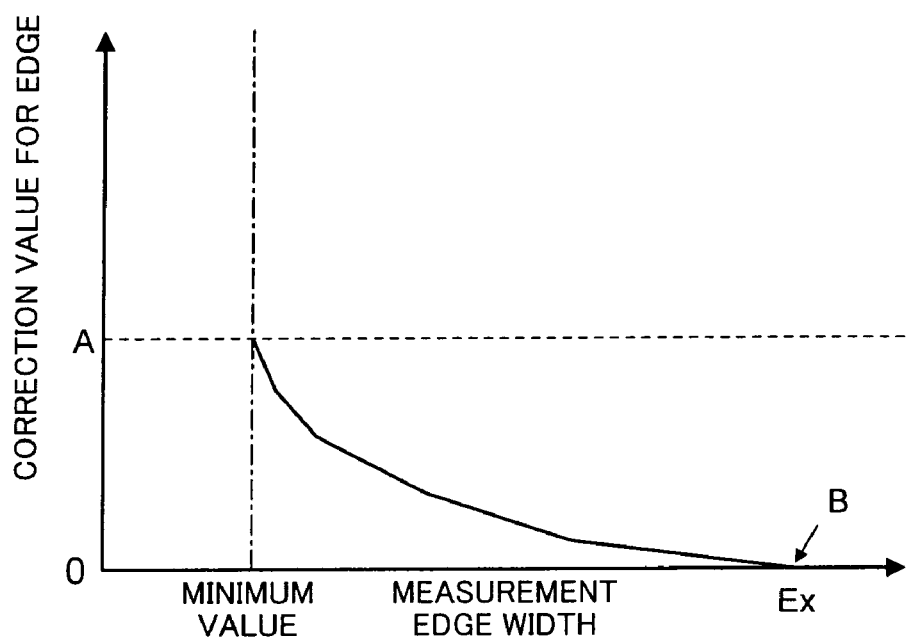
FIG. 10 is a graph indicating the relationship between an edge width obtained through the simulation using the reference beam and a correction value for a calculated edge position.
Figure 11:
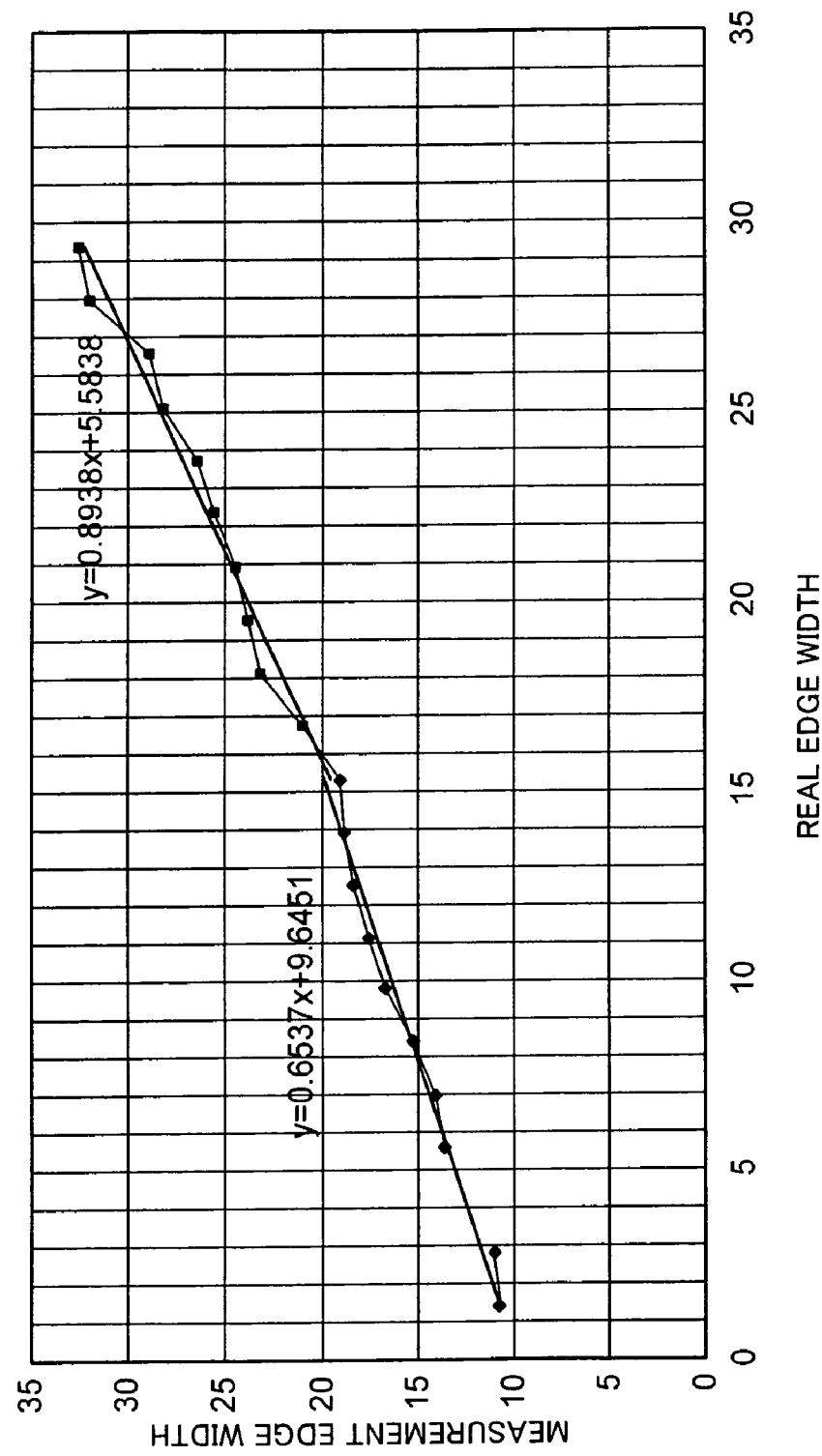
FIG. 11 is a graph indicating the relationship between the real edge width and the edge width (measurement edge width) obtained through the simulation.

The edge width and the correction value for the edge position are calculated in the same manner for each of the various edge widths to create the correspondence between the edge width calculated by using the reference beam and the correction value for the edge position as illustrated in FIG. 10, and the correspondence between the measurement edge width and the actual edge width as illustrated in FIG. 11. In FIG. 10, the horizontal axis represents the edge width based on the simulation results, while the vertical axis represents the correction value for the edge position. The minimum value of the edge width is substantially equal to the beam diameter, and the correction value is approximately a half of the beam diameter (point A in FIG. 10), which corresponds to FIG. 3A.

As the edge width becomes larger, the correction value becomes smaller. This is because the intensity distribution includes the intensity of the secondary electrons from the inclined portion of the edge, and the ratio of the influence of the beam width on the entire intensity is decreased when the angle of inclination is small. A point B in FIG. 10 illustrates that the correction value for the edge position is zero at Ex of the edge width. Specifically, the edge width be which is larger than Ex guarantees an accurate length measurement. Thus, in this situation, the line width and the edge width are accurately calculated by applying and scanning a beam to create a line profile and differentiating that line profile. At that time, if the edge width is larger than Ex, the values of the line width and the edge width is not affected by the intensity distribution related to the beam width.

FIG. 11 is a graph indicating the correspondence between the real edge width and the measurement edge width. The horizontal axis in FIG. 11 represents the real edge width while the vertical axis represents the measurement edge width.

If necessary, it is possible to previously create a correspondence table denoting the correspondence between the real edge width and the measurement edge width illustrated in FIGS. 10 and 11. For example, under consideration of the symmetric property of the beam and the difference in the beam diameter in the X and Y directions, it is possible to create four tables for the rising edge and the falling edge in each of the X and Y directions for each apparatus, and store the tables in the storage unit. In performing length measurement of a pattern, the correspondence table is referred to determine whether or not correction of the edge width is necessary. If the correction is necessary, the length measurement value is corrected based on the edge width of the measurement result.

Use of the correspondence table enables not only the measurement of the line width but also the calculation of the inclination angle of each edge of a pattern formed on a substrate.

For example, assuming that the pattern is formed as illustrated in FIG. 3B, the edge width and the width of the edge portion of the pattern are measured. Then, with reference to the correspondence table, it is determined whether or not the width of the edge portion falls within a range where the correction is needed for the width of the edge portion.

If the edge width does not fall within the correction-needed range, the measured width of the edge portion and a height H of the pattern are used to determine the inclination angle of the edge. Moreover, if the measured width of the edge portion falls within the correction-needed range, a corrected edge width W corresponding to the measured edge width is calculated on the basis of the correspondence table. By using the corrected edge width W and the height H, the inclination angle of the edge can be determined accurately.

(Pattern Measurement Method)

Figure 12:
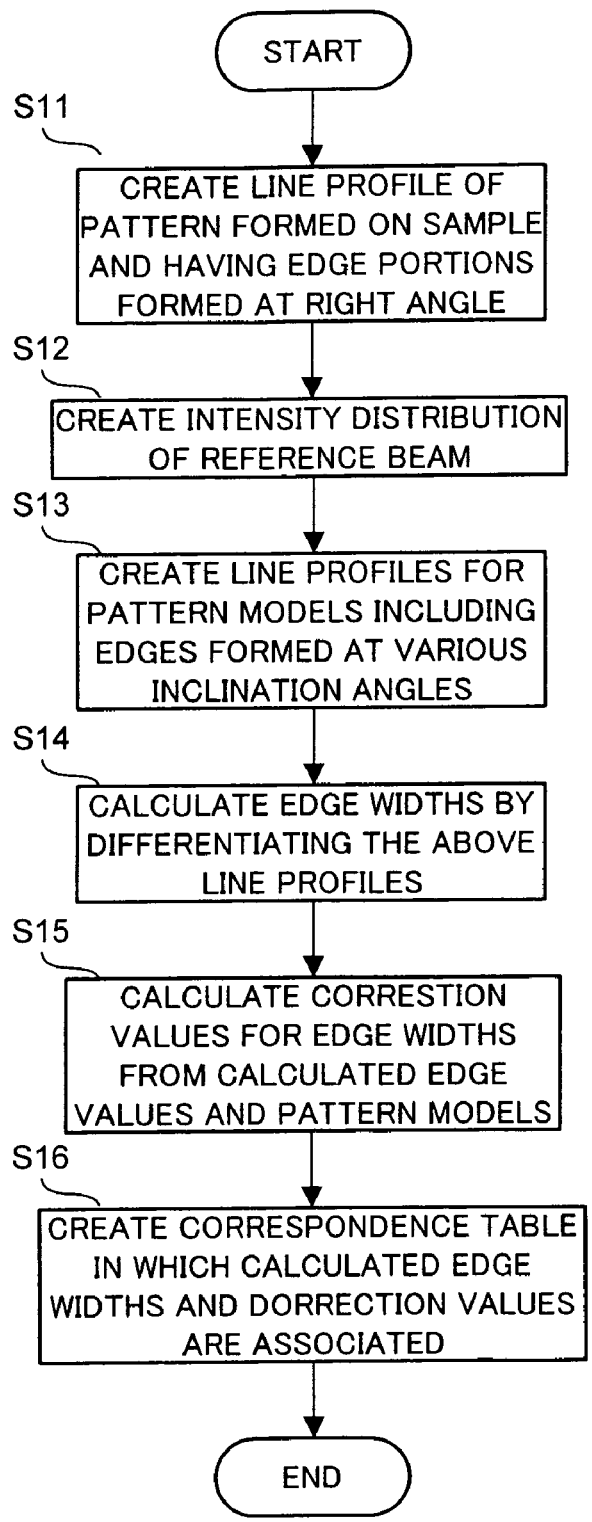
FIG. 12 is a flowchart indicating an example of processing to create the correspondence between the edge widths obtained through the simulations and the correction values for the edge positions with respect to the real edge width.

Next, a pattern measurement method using a charged particle beam is described with reference to FIGS. 12 and 13. FIG. 12 is a flowchart illustrating an example of processing to create the correspondence between the edge widths obtained through the simulations and the correction values for the edge positions.

First, in the first step S11, a line profile is created for a pattern formed on a sample and having edge portions formed at a right angle. A charged particle beam is scanned to pass over the edge portions of the pattern. Thereby, an SEM image of the pattern is obtained, and then luminance signals are obtained from the SEM image of the pattern to create a line profile which represents the luminance signals.

Next, in step S12, the intensity distribution of a reference beam is created. The line profile obtained in step S11 does not include the intensity of secondary electrons from the inclined portions of the edges. Hence, this line profile can be regarded as the intensity distribution of the charged particle beam itself. Specifically, a distribution on a space of the intensity distribution at the rising point of the pattern is combined with an intensity distribution, and a distribution on a space of the intensity distribution at the falling point of the pattern is combined with the intensity distribution. The combined intensity distribution is set as the intensity distribution of the reference beam.

Next, in step S13, line profiles are created for pattern models including edges formed at various inclination angles. The intensity distribution of the reference beam created in step S12 is used on the respective pattern models to calculate values corresponding to the overlaps between their edge portions and the reference beam through simulations, and create the line profiles of the edge portions. The line profiles of the edge portions are added to the line profile of a top portion in the edge of 90 degrees, to thereby create line profiles for the pattern models.

Next, in step S14, the line profiles are differentiated to calculate edge widths. In step S15, from the calculated edge widths and the pattern models, correction values for the edge widths are calculated.

Next, in step S16, the calculated edge widths and correction values are associated with one another to create a correspondence table.

The following describes processing to perform accurate length measurement using the correspondence table between the edge widths and the correction values for the edge widths which are calculated through the simulations.

Figure 13:
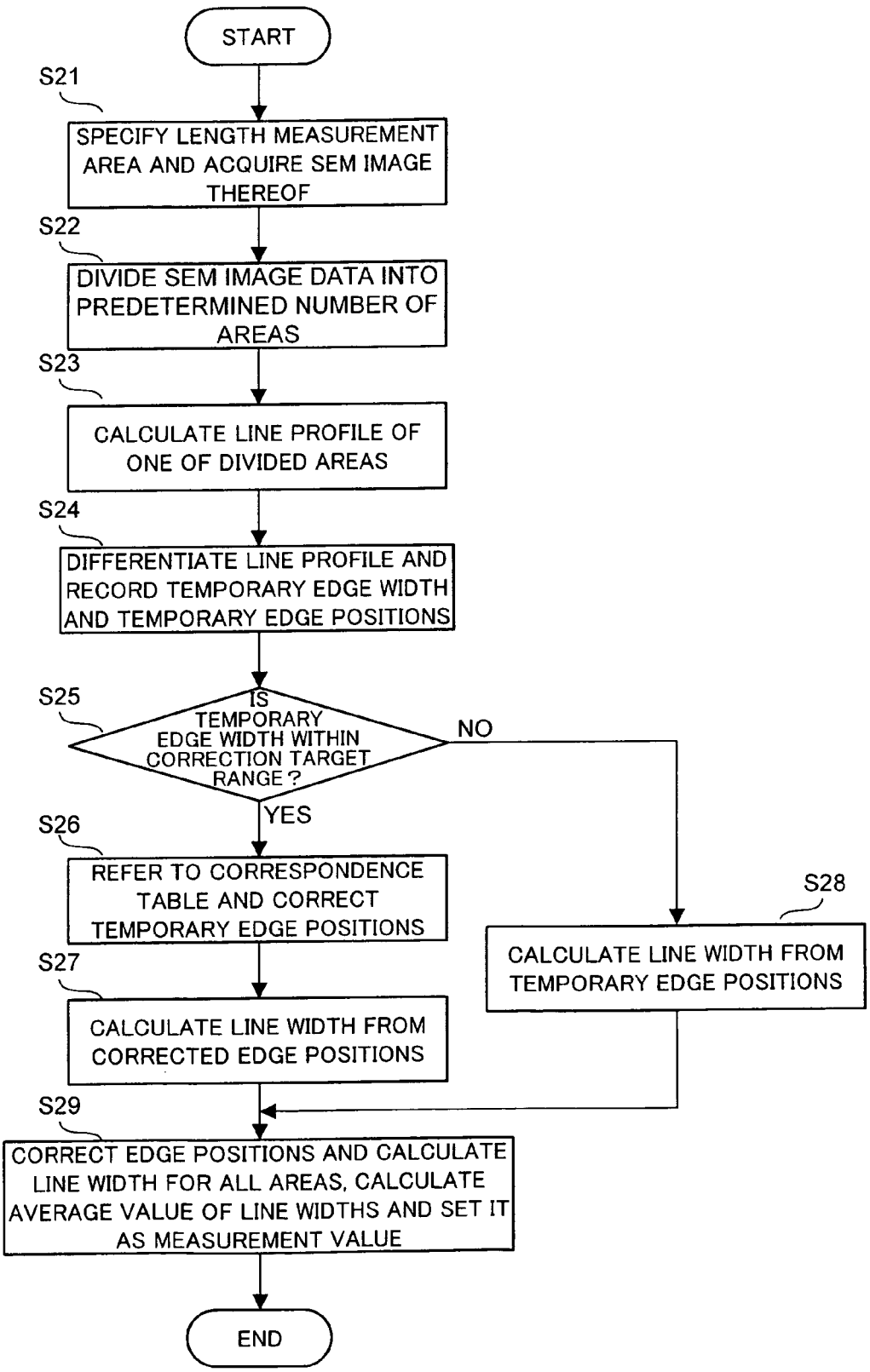
FIG. 13 is a flowchart indicating an example of pattern measurement processing using an electron beam.

FIG. 13 is a flowchart denoting an example of processing to accurately measure the line width of a pattern even when the pattern is formed to have as small an edge width as the edge angle is closer to 90 degrees.

In the line width measurement processing in FIG. 13, an SEM image of a sample with a pattern formed thereon is assumed to be acquired in advance and SEM image data is assumed to be stored in the storage unit 55.

First of all, in step S21, a desired length measurement area is specified, and a corresponding SEM image is acquired. This SEM image data is extracted from the storage unit 55.

Next, in step S22, the SEM image data acquired in step S21 is divided into a predetermined number of areas.

Next, in step S23, a line profile is calculated for one of the areas obtained by the division in step S22. The calculation of the line profile is performed by causing the profile creation unit 21 of the controller 20 to extract luminance information in the SEM image data.

Next, in step S24, the line profile calculated in step S23 is subjected to primary differentiation to calculate an edge width and edge positions. These edge width and edge positions are set as temporary edge width and temporary edge positions. The primary differentiation is performed with line width measurement unit 24, for example, by using a differential filter such as a Sobel filter used in general image processing. From each result of the primary differentiation, positions taking the maximum value and the minimum value in the amount of signal are recorded as a temporary line width. Moreover, positions taking the local maximum value and the local minimum value of the amount of signal corresponding to the edge portions are recorded as temporary edge positions.

In the next step S25, it is determined whether or not the width of each edge portion of the pattern falls within a correction target range within which correction is necessary. The width of the edge portion is obtained by calculating the distance between the positions showing the maximum value and the minimum value of the differential profile obtained by differentiating the line profile. Based on this calculation, reference is made to a correspondence table, and if there exists a beam width value corresponding to the calculated edge width, it is determined that the edge width falls within the correction target range. If it is determined that the edge width falls within the correction target range, the processing proceeds to step S26. If it is determined that the edge width does not fall within the correction target range, the processing proceeds to step S28.

In the next step S26, each edge position is corrected. The edge position is corrected by referring to the correspondence table and finding therefrom a correction value corresponding to the calculated temporary edge width. This correction value is added to the edge position of the length measurement value to thereby correct the edge position to an accurate edge position that is not affected by the beam width.

In the next step S27, the pair of the edge positions thus corrected is used to calculate a line width.

On the other hand, in step S28, since there is no need to correct the measured temporary edge width and temporary edge positions, these values are used to calculate a length measurement value.

Next, in step S29, the temporary edge width and the temporary edge positions are calculated and the length measurement value is corrected for all the areas in the length measurement area. In other words, steps S23 to S28 are executed repeatedly until the values are calculated for all the areas.

As described above, in the pattern measurement apparatus and the pattern measurement method according to this embodiment, a charged particle beam is scanned over a pattern formed on a sample and having edge portions formed at a right angle to create a line profile of the pattern. From this line profile, the intensity distribution of a reference beam is created. Then, on the basis of the intensity distribution of the reference beam, a simulation is performed on each of pattern models including edges formed at various inclination angles to create line profiles. From those line profiles, edge widths are calculated to thereby calculate edge widths reflecting an influence of the width of the reference beam.

Correction values for the edge position are calculated from the edge widths obtained by the simulations as well as the pattern models to create a correspondence table in which the edge widths and the calculated correction values are associated with one another. This correspondence table is utilized to correct the measurement value. Thereby, accurate length measurement is possible even when the actually measured line width includes an error due to a small width of each edge portion.

Moreover, because of utilizing the table in which the edge widths of the pattern models and the edge widths obtained by the simulations are associated with one another, it is possible to accurately calculate the inclination angle of the edge portion.

Note that this embodiment is described based on the case where an electron beam is used as the charged particle beam applied onto the sample. The present invention is not limited thereto and is applicable to apparatuses using an ion beam, for example.

What is claimed is:

1. A pattern measurement apparatus comprising:
   a beam intensity distribution creation unit configured to scan a charged particle beam over a reference pattern formed on a sample to create a line profile of the reference pattern, and create a reference-beam intensity distribution in which the charged particle beam is regarded as a reference beam, the reference pattern having edge portions formed at a right angle to a horizontal plane;
   an edge width detection unit configured to determine line profiles for pattern models by use of the reference-beam intensity distribution, and calculate edge widths reflecting an influence of a width of the reference beam, the pattern models including edge portions formed at various inclination angles; and
   a correspondence table creation unit configured to calculate correction values for edge positions from the calculated edge widths and the pattern models, and create a correspondence table in which the edge widths and the correction values are associated with one another.

2. The pattern measurement apparatus according to claim 1, wherein the beam intensity distribution creation unit further creates the reference-beam intensity distribution so as to include a first distribution on a first side of an intensity distribution at a rising point of the reference pattern and a second distribution on a second side of an intensity distribution at a falling point of the reference pattern, the first and second sides being located at which the reference pattern is not formed.

3. The pattern measurement apparatus according to claim 2, wherein the edge width detection unit further creates the line profiles for the pattern models including the edges formed at the various inclination angles by combining the line profile of the reference pattern and corresponding line profiles of edge portions, the line profiles of corresponding edge portions being created by calculating amounts corresponding to overlaps between the reference beam and the edge portions under assumption that an electron beam having the reference-beam intensity distribution is applied to the pattern models in a scanning manner.

4. The pattern measurement apparatus according to claim 3, further comprising a line width measurement unit configured to measure a line width of a pattern, wherein
   the line width measurement unit measures an edge width and edge positions of a pattern formed on a sample, sets the edge width and the edge positions as a temporary edge width and temporary edge positions, detects a correction value for each of the temporary edge positions by referring to the correspondence table, and corrects each of the temporary edge positions by using the correction value to thereby calculate the line width of the pattern.

5. The pattern measurement apparatus according to claim 4, wherein
   the correspondence table creation unit further creates an edge width correspondence table in which edge widths of the pattern models and the edge widths calculated by the edge width detection unit are associated with one another, and
   the line width measurement unit calculates an inclination angle of each edge of the pattern based on a height of the pattern and a real edge width which is determined by referring to the edge width correspondence table for the temporary edge width.

6. A pattern measurement method comprising the steps of:
   scanning a charged particle beam over a reference pattern formed on a sample to create a line profile of the reference pattern, the reference pattern having edge portions formed at a right angle to a horizontal plane;
   creating a reference-beam intensity distribution in which the charged particle beam is regarded as a reference beam on the basis of the line profile;
   creating line profiles for pattern models on the basis of the reference-beam intensity distribution, the pattern models including edge portions formed at various inclination angles;
   creating differential profiles by differentiating the line profiles;
   calculating edge widths reflecting an influence of a width of the reference beam based on the differential profiles; and
   calculating correction values for edge positions from the calculated edge widths and the pattern models, and creating a correspondence table in which the edge widths and the correction values are associated with one another.

7. The pattern measurement method according to claim 6, wherein the step of creating the reference-beam intensity distribution includes a step of creating the reference-beam intensity distribution by combining a first distribution on a first side of an intensity distribution at a rising point of the reference pattern and a second distribution on a second side of an intensity distribution at a falling point of the reference pattern, the first and second sides being located at which the reference pattern is not formed.

8. The pattern measurement method according to claim 7, wherein the line profiles for the pattern models including the edges formed at the various inclination angles are each created by combining the line profile of the reference pattern and line profiles of corresponding edge portions, the line profiles of corresponding edge portions are created by calculating amounts corresponding to overlaps between the reference beam and the edge portions under assumption that an electron beam having the reference-beam intensity distribution is applied to the pattern models in a scanning manner.

9. The pattern measurement method according to claim 8, further comprising the steps of:
 measuring an edge width and edge positions of a pattern formed on a sample and setting the edge width and the edge positions as a temporary edge width and temporary edge positions;
 detecting a correction value for each of the temporary edge positions by referring to the correspondence table; and
 correcting each of the temporary edge positions by using the correction value to thereby calculate a line width of the pattern.

10. The pattern measurement method according to claim 8, further comprising the steps of:
 creating an edge width correspondence table in which edge widths of the pattern models and the edge widths calculated by the edge width detection unit are associated with one another;
 detecting a real edge width corresponding to the temporary edge width by referring to the edge width correspondence table; and
 calculating an inclination angle of each edge of the pattern based on a height of the pattern and the real edge width.

* * * * *